United States Patent [19]

Kwon

[11] Patent Number: 5,559,372
[45] Date of Patent: Sep. 24, 1996

[54] THIN SOLDERED SEMICONDUCTOR PACKAGE

[75] Inventor: Yong T. Kwon, Seoul, Rep. of Korea

[73] Assignee: Goldstar Electron Co., Ltd., Choongchungbook-Do, Rep. of Korea

[21] Appl. No.: 370,903

[22] Filed: Jan. 10, 1995

[30] Foreign Application Priority Data

Dec. 19, 1994 [KR] Rep. of Korea .................. 94-35092

[51] Int. Cl.⁶ .......................... H01L 23/48; H01L 23/13; H01L 29/44
[52] U.S. Cl. .................. 257/692; 257/773; 257/779; 257/666; 257/676
[58] Field of Search ................ 257/666, 772–776, 257/779, 670, 676, 690, 692, 698, 672–675, 737, 738, 786–788, 736, 734

[56] References Cited

U.S. PATENT DOCUMENTS

| | | | |
|---|---|---|---|
| 3,706,409 | 12/1972 | Lederer | 257/690 |
| 4,336,551 | 6/1982 | Fujita et al. | 257/738 |
| 4,626,478 | 12/1986 | van Dyk Soerewyn | 257/673 |
| 4,811,081 | 3/1989 | Lyden | 257/672 |
| 5,021,866 | 6/1991 | Sudo et al. | 257/736 |
| 5,123,163 | 6/1992 | Ishikawa et al. | 257/738 |
| 5,132,772 | 7/1992 | Fetty | 257/786 |
| 5,388,577 | 2/1995 | Hubbard | 257/734 |
| 5,467,864 | 4/1995 | Kim | 257/778 |

FOREIGN PATENT DOCUMENTS

| | | | |
|---|---|---|---|
| 0032267 | 11/1977 | Japan | 257/666 |
| 0048954 | 4/1980 | Japan | 257/673 |
| 0278754 | 11/1989 | Japan | 257/666.3 |
| 0106943 | 4/1990 | Japan | 257/786 |
| 0016146 | 1/1991 | Japan | 257/738 |
| 0065166 | 3/1992 | Japan | 257/786 |

Primary Examiner—Robert P. Limanek
Assistant Examiner—Alexander Oscar Williams
Attorney, Agent, or Firm—Lowe, Price, LeBlanc & Becker

[57] ABSTRACT

A semiconductor package directly soldering the chip pad to the inner leads and a method for producing the package are disclosed. The chip pad is placed on the bottom surface of an inner lead extending from opposed sides of the chip pad. A plurality of inner lead holes are formed in the interconnection parts between the inner leads and the auxiliary leads. A solder resist film bonded to the lead frame has a plurality of solder resist holes communicating with the inner lead holes. In order to produce the package, a lead pattern is formed and the lead frame is etched using the lead pattern, so that the inner lead holes and the solder resist holes are formed and the inner leads come into direct contact with the chip pad. Thereafter, the chip pad is soldered to the inner leads.

3 Claims, 5 Drawing Sheets

THIN SOLDERED SEMICONDUCTOR PACKAGE

BACKGROUND OF THE INVENTION

1. Field of the Invention

The present invention relates in general to semiconductor packages and to an improvement in structures of the packages for connecting a plurality of pads of a semiconductor chip to their inner leads of a lead frame but directly connecting a chip pad of the lead frame to the inner leads through a soldering, thereby achieving the recent trend of diminution and thinness of the packages.

2. Description of the Prior Art

With reference to FIG. 1, there is shown a typical semiconductor package. In the drawing, the reference number 10 is a semiconductor chip which is bonded to a chip pad 1 of a lead frame 20 using die bonding epoxy 2. A plurality of pads of the semiconductor chip 10 are electrically connected to a plurality of inner leads 3 of the lead frame 20 respectively by means of their associated metal wires 5, the opposed ends of which metal wires 5 are bonded to the pads of the chip 10 and to the inner leads 3 of the lead frame 20. After wire bonding for electrically connecting the chip 10 to the inner leads 3, a predetermined volume including the chip 10, the inner leads 3 and the metal wires 5 is hermetically packaged using an epoxy molding compound, thus to form a package body 6 of the package. The lead frame 20 also includes a plurality of outer leads 4, which leads 4 extend outward from the inner leads 3 to the outside of the package body 6 at opposed sides of the body 6. The outer leads 4 of the lead frame 20 extend to a predetermined length and are trimmed and formed into a predetermined bent configuration. That is, the outer leads 4 of the lead frame 20 are bent inward and downward.

The above semiconductor package is produced by the following process.

The package producing process is started at a die bonding step for bonding the semiconductor chip 10 to the top surface of the chip pad 1 of the lead frame 20 using the die bonding epoxy 2. The die bonding step is followed by a wire bonding step for electrically connecting the pads of the semiconductor chip 10 to the inner leads 3 of the lead frame 20 by means of the metal wires 5. After the wire bonding step, a molding step for hermetically molding, using the epoxy molding compound, the predetermined volume including the semiconductor chip 10, the inner leads 3 of the lead frame 20 and the metal wires 5 is carried out, thus to form the package body 6. The molding step is followed by a trimming step in which lead support dambars (not shown) are cut so as to divide the integrated packages into individual packages and forming step in which the outer leads 4 of the lead frame 20 are formed into the predetermined bent configuration.

In the above semiconductor package produced through the above process, the semiconductor chip is electrically connected to the inner leads of the lead frame by means of the plurality of the metal wires bonded to the semiconductor chip and to the inner leads through the wire bonding step. Therefore, it is difficult in the typical semiconductor package to achieve the recent trend of diminution and thinness of the package. Another problem of the above package is resided in that the metal wires cause parasitic inductance and resistance which deteriorate the electric performance of the package.

SUMMARY OF THE INVENTION

It is, therefore, an object of the present invention to provide a semiconductor package in which the above problems can be overcome which uses no metal wires electrically connecting the pads of a semiconductor chip to inner leads of a lead frame but directly connects a chip paddle of the lead frame to the inner leads through a soldering using a solder resist film, thus to achieve the recent trend of diminution and thinness of the package.

It is another object of the present invention to provide a method for producing the above semiconductor package.

In an aspect, the present invention provides a semiconductor package comprising a chip pad placed on a bottom surface of an inner leading extending from a lead frame to opposite sides of the chip pad; at least one inner hole formed in the inner lead; and a solder resist film bonded to the bottom surface of the lead frame, the solder resist film having at least one solder resist hole communicating with the inner lead hole; wherein the chip pad is soldered to the lead frame at the inner lead hole.

In another aspect, the present invention provides A method for producing a semiconductor package comprising the steps of: bonding a solder resist film to a lead frame; forming a lead pattern and etching, using the lead pattern, the lead frame such that an inner lead hole and a solder resist hole are formed in the lead frame and in the solder resist film respectively and an inner lead of the lead frame comes into direct contact with a chip pad; soldering the chip pad to the inner lead; molding a predetermined volume of the lead frame using epoxy molding compound; trimming a side rail of the lead frame and forming an outer lead of the lead frame into a predetermined configuration; and plating the outer lead.

BRIEF DESCRIPTION OF THE DRAWINGS

Other objects and aspects of the invention will become apparent from the following description of embodiments with reference to the accompanying drawings in which:

FIGS. 3A to 3C are plan views of different-shaped inner lead holes of a semiconductor package of the present invention respectively, in which:

FIG. 3A shows a circular hole;

FIG. 3B shows a rectangular hole; and

FIG. 3C shows a semicircular hole;

FIGS. 6A to 6B are plan views showing a cutting step for dividing the integrated packages of the invention into individual packages, in which:

FIG. 6A partially shows the integrated packages before the trimming step; and

FIG. 6B shows a unit package after the trimming step; and

DESCRIPTION OF THE PREFERRED EMBODIMENTS

Figure 1:
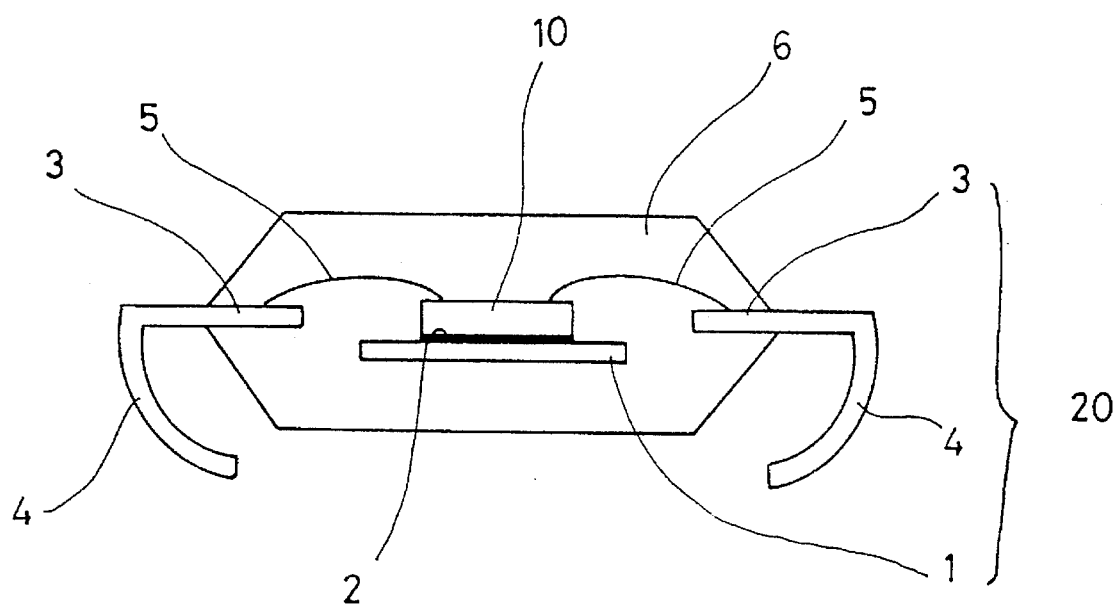
FIG. 1 is a sectional view showing a construction of a typical semiconductor package.
Figure 2:
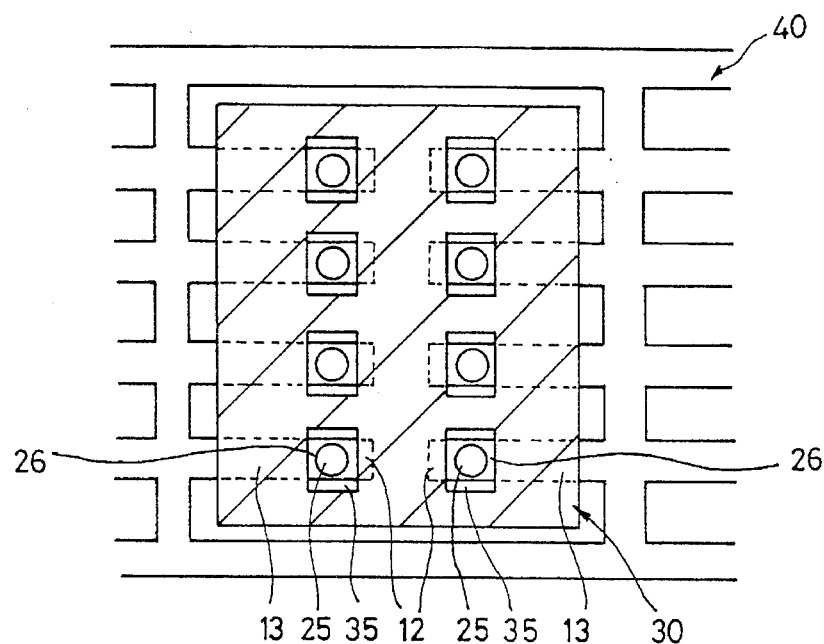
FIG. 2 is a plan view of a semiconductor package in accordance with a primary embodiment of the present invention.

With reference to FIG. 2, there is shown a semiconductor package in accordance with a primary embodiment of the present invention. In this drawing, the reference numeral 30 denotes a solder resist film that is bonded to a predetermined portion of a lead frame 40 using an adhesive (not shown). The lead frame 40 is provided with a plurality of inner leads 13.

An inner lead hole 25 is formed in the inner lead 13. In the embodiment of FIG. 2, each inner lead 13 has one inner lead hole 25, however, it should be understood that each inner lead 13 of the invention may have two or more inner lead holes 25 without affecting the functioning of the invention. The inner lead holes 25 are adapted for enlarging the soldering area and for reducing possible quality inferiority of resulting packages.

Figure 3A:
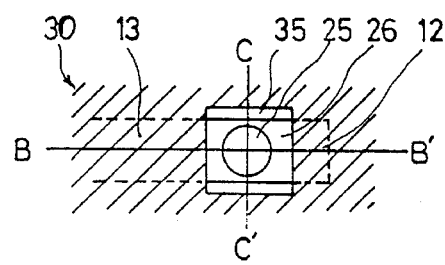
Figure 3B:
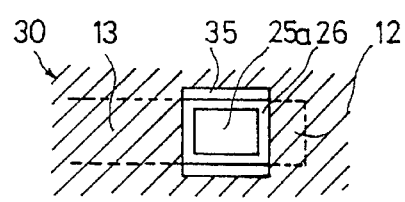
Figure 3C:
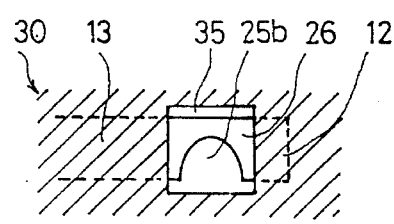

In accordance with the invention, each inner lead hole 25 may be formed into a circular configuration as shown in FIG. 3A, a rectangular configuration as shown in FIG. 3B or a semicircular configuration as shown in FIG. 3C. The rectangular inner lead hole of FIG. 3B and the semicircular inner lead hole of FIG. 3C are represented by the reference numerals 25a and 25b respectively.

Figure 4A:
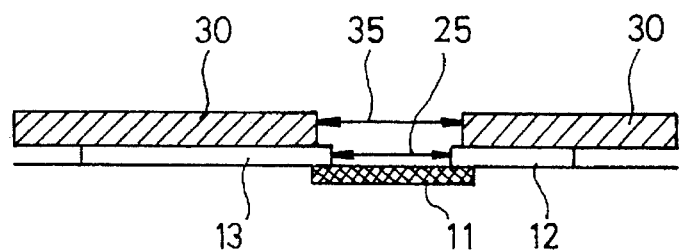
FIG. 4A is a sectional view of the circular inner lead hole of the invention taken along the section line B—B' of FIG. 3A.
Figure 4B:
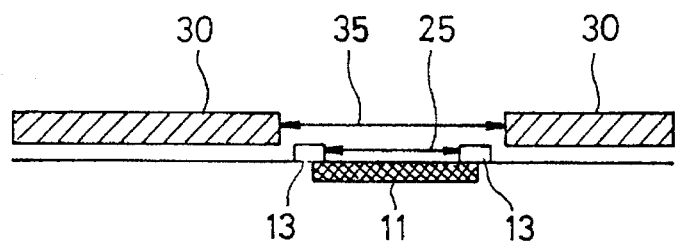
FIG. 4B is a sectional view of the circular inner lead hole of the invention taken along the section line C—C of FIG. 3A.

FIG. 4A is a sectional view of the circular inner lead hole 25 taken along the section line B—B' of FIG. 3A, while FIG. 4B is a sectional view of the circular inner lead hole 25 taken along the section line C—C' of FIG. 3A. As shown in FIGS. 4A and 4B, the inner leads 13 are bonded to the top surface of a chip pad 11. Each inner lead hole 25 is defined by an inner lead 13. The solder resist film 30 is bonded to the top surfaces of the inner leads 13. The solder resist film 30 is provided with a plurality of solder resist holes 35 which are formed in portions of the film 30 corresponding to the inner lead holes 25 respectively and have a size slightly larger than that of the inner lead holes 25.

As FIG. 4B is a sectional view of each circular inner lead hole 25 taken along the section line C—C' of FIG. 3A, this drawing shows the inner lead 13 bonded to opposed sides of the top surface of the chip pad 11 differently from FIG. 4A. This drawing also shows the inner lead hole 25 formed in the inner lead 13. In FIG. 4B, there is shown one of the solder resist holes 35 which are formed in portions of the solder resist film 30 corresponding to the inner lead holes 25 respectively and have the size slightly larger than that of the inner lead holes 25. Please noted that the size difference between the solder resist holes 35 shown in FIGS. 4A and 4B is merely caused by the directional difference between the section lines B—B' and C—C' of FIG. 3A. Of course, it should be understood that the size of each solder resist hole 35 is not limited to the sizes shown in FIGS. 3A to 3C but may be changed as demanded.

The above semiconductor package is produced by the following process.

In order to produce the package, the solder resist film 30 is primarily bonded to the lead frame 40, thus to prepare the lead frame 40 having the solder resist film 30. Thereafter, the lead frame 40 having the solder resist film 30 is etched using a lead pattern (not shown) in such a manner that the inner leads 13 of the lead frame 40 come into direct contact with the chip pad 11 as shown in FIG. 4B. After etching the lead frame 40 using the lead pattern, a photodevelopment step is carried out. In the photodevelopment step, the plurality of solder resist holes 35 are formed by etching predetermined portions of the solder resist film 30 corresponding to the inner lead holes 25, 25a or 25b of FIG. 3A, 3B or 3C, which solder resist holes 35 have the size slightly larger than that of the inner lead holes in accordance with demand of users.

Figure 5A:
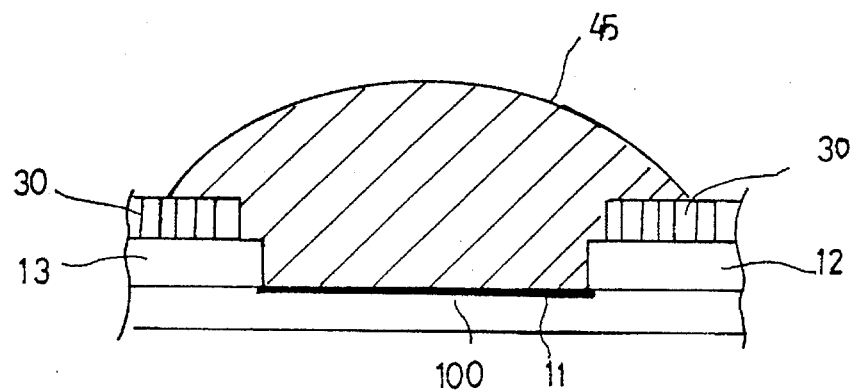
FIGS. 5A to 5C are sectional views showing a soldering step for soldering a chip paddle of a lead frame to inner leads of the lead frame in accordance with the present invention.
Figure 5B:
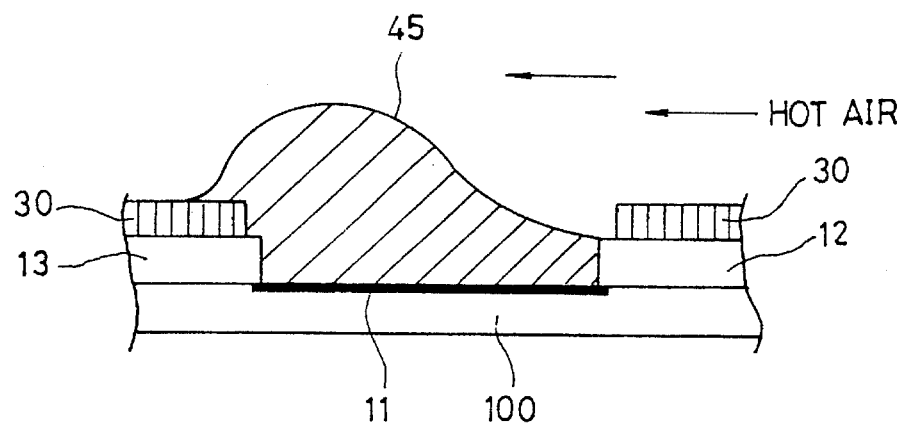
Figure 5C:
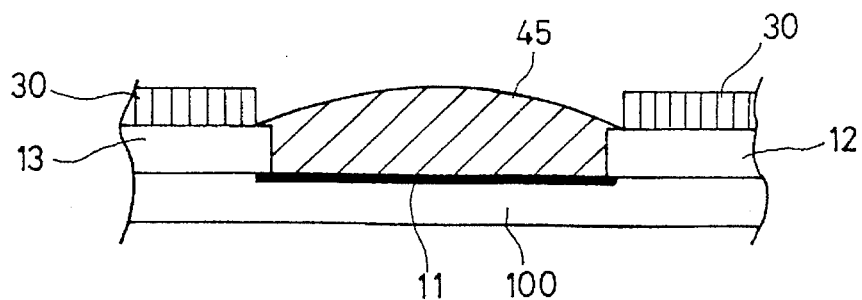

After forming the solder resist holes 35, a semiconductor chip 100 prepared by a sawing step is bonded, as shown in FIG. 5A, to the chip pad 11 of FIGS. 4A and 4B. The solder resist holes 35 are formed in the solder resist film 30 in such a manner that the holes 35 communicate with their associated inner lead holes 25 defined by the chip pad 11, the inner leads 13 as shown in FIGS. 2, 4A and 4B, which holes 35 have the size slightly larger than that of the inner lead holes 25. Thereafter, small amount of solder cream (not shown) is applied to each solder resist hole 35 and to each inner lead hole 25 and heated at a predetermined temperature so that a solder 45 is melted as shown in FIG. 5A. When the solder 45 is melted as shown in FIG. 5A, the steps shown in FIGS. 5B and 5C are carried out.

Hereinbelow, the steps shown in FIGS. 5A to 5C will be described in detail.

FIG. 5A shows a state in that the solder 45 has been heated and melted. As shown in this drawing, the melted solder 45 sufficiently covers the chip paddle 11 having the semiconductor chip 100 such that the top of the melted solder 45 is higher than the top surface of the solder resist film 30 and partially covers the film 30. When hot air is blown to the melted solder 45 in this state in a predetermined direction as shown at the arrow of FIG. 5B, the surplus solder 45 over the solder resist film 30 is pushed out by the hot air in the direction of the arrow, so that an appropriate amount of solder 45 remains on the chip pad 11 as shown in FIG. 5C. That is, the surplus solder over the solder resist film 30 is pushed out by the hot air but the appropriate amount of solder 45 remains in each solder resist hole 35 of the solder resist film 30.

Figure 7:
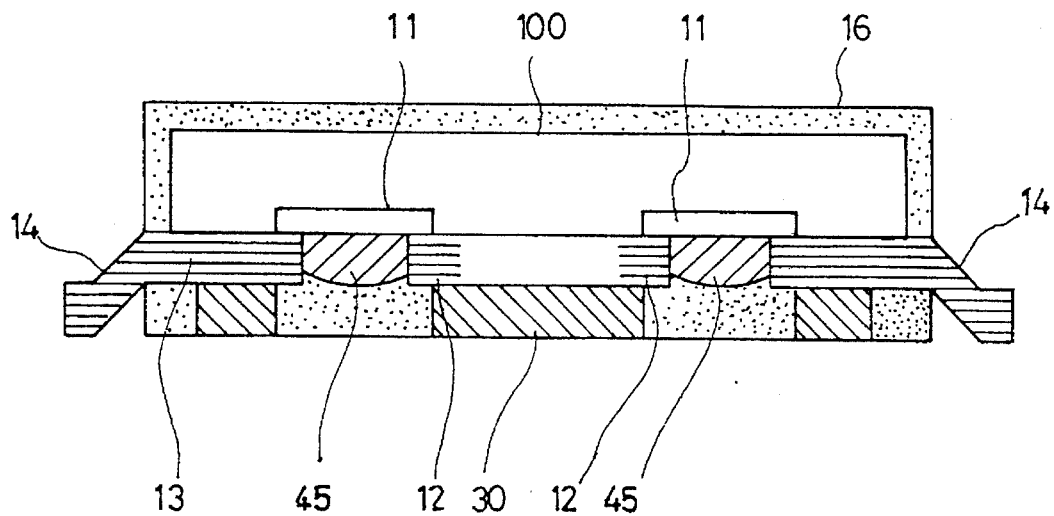
FIG. 7 is a sectional view of the unit package of the invention taken along the section line E—E' FIG. 6B, showing a construction of the semiconductor package after a trimming and forming step.
Figure 6A:
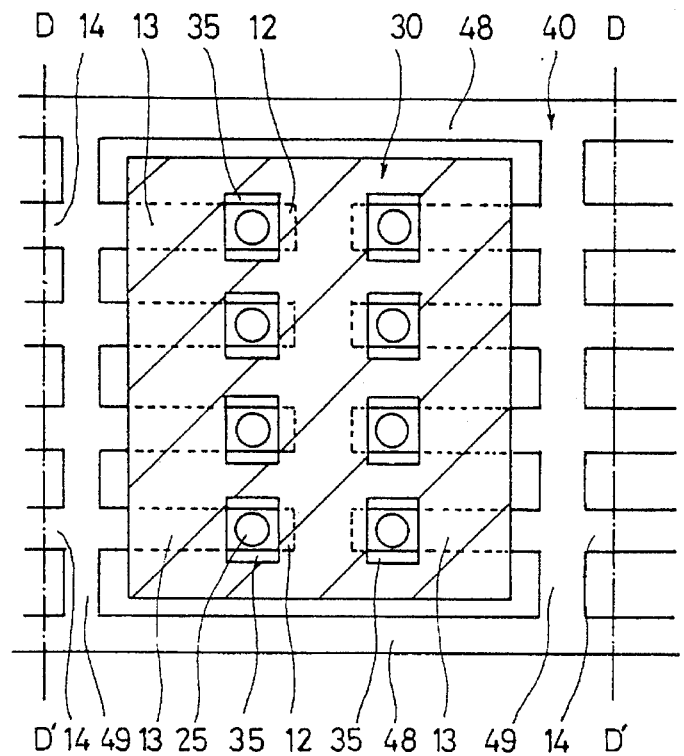
Figure 6B:
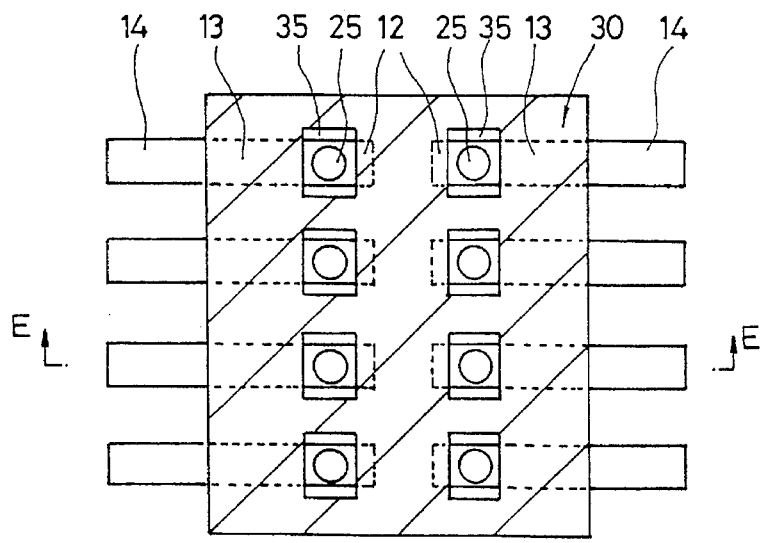

After the above soldering step, a predetermined volume of the package is sealed using epoxy molding compound through a molding step in order for protecting the inside elements of the package, that is, the chip 100, and the inner leads 13 of the lead frame 40, from the outside physical impact and from the outside chemical change. That is, the predetermined volume including the semiconductor chip 100, and the inner leads 13 is hermetically sealed using the epoxy molding compound, thus to form a package body 16 as shown in FIG. 7, which drawing is a sectional view of the semiconductor package taken along the section line E—E' of FIG. 6B, showing a construction of the package after a trimming and forming step. After the molding step, the semiconductor package is cured for a predetermined time, thus to cure the package body 16. The package body curing step is followed by a trimming step for trimming lead support dambars 49 so as to divide the integrated packages into individual packages as shown in FIGS. 6A and 6B. Each package is subjected to a trimming and forming step for trimming and forming the outer leads 14 of the lead frame 40 into a predetermined bent configuration as shown in FIG. 7.

The cutting step of FIGS. 6A and 6B and the trimming and forming step of FIG. 7 will be described in detail hereinbelow.

FIG. 6A partially shows the integrated packages before the trimming step. The packages integrated into a single body by means of the dambars 49 are cut along the cutting lines D—D' of FIG. 6A, so that the integrated packages are divided into individual packages. After the trimming step, the dambars 49 and a pair of side rails 48 of each package are removed so that each package has the configuration of FIG. 6B. In each semiconductor package of FIG. 6B, a plurality of outer leads 14 of the lead frame 40 extend outward from the opposed sides of the solder resist film 30. In the trimming and forming step, the outer leads 14 are trimmed and formed into the predetermined configuration, thus to provide the resulting package of FIG. 7.

As described above, a semiconductor package in accordance with the present invention has no metal wire for electrically connecting the pads of a semiconductor chip to inner leads of a lead frame but directly connects a chip paddle of the lead frame to the inner leads through a soldering. A method for production of the package of the invention is thus free from the typical wire bonding step. The present invention thus achieves the recent trend of diminution and thinness of the semiconductor packages.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor package comprising:

a chip pad placed on a bottom surface of an inner lead extending from a lead frame to opposed sides of said chip pad, at least one inner lead hole formed in said inner lead; and a solder resist film bonded to the top surface of said lead frame, said solder resist film having at least one hole communicating with said inner lead hole; wherein the chip pad is soldered to the lead frame at the inner lead hole, wherein said inner lead hole is a rectangular hole.

2. A semiconductor package comprising:

a chip pad placed on a bottom surface of an inner lead extending from a lead frame to opposed sides of said chip at least one inner lead hole formed in said inner lead; and a solder resist film bonded to the top surface of said lead frame, said solder resist film having at least one hole communicating with said inner lead hole; wherein the chip pad is soldered to the lead frame at the inner lead hole, wherein said inner lead hole is a semicircular hole.

3. A semiconductor package comprising:

a chip pad placed on a bottom surface of an inner lead extending from a lead frame to opposed sides of said chip pad, at least one inner lead hole formed in said inner lead; and a solder resist film bonded to the top surface of said lead frame, said solder resist film having at least one hole communicating with said inner lead hole; wherein the chip pad is soldered to the lead frame at the inner lead hole, wherein said inner lead hole is smaller than said solder resistor hole.

* * * * *